United States Patent [19]

de Couasnon

[11] Patent Number: 4,486,881

[45] Date of Patent: Dec. 4, 1984

[54] DEVICE FOR REAL-TIME CORRECTION OF ERRORS IN DATA RECORDED ON A MAGNETIC MEDIUM

[75] Inventor: Tristan de Couasnon, Paris, France

[73] Assignee: Thomson-CSF, Paris, France

[21] Appl. No.: 274,382

[22] Filed: Jun. 17, 1981

[30] Foreign Application Priority Data

Jun. 19, 1980 [FR] France .................................. 80 13597

[51] Int. Cl.$^3$ ............................................. G06F 11/10
[52] U.S. Cl. ........................................ 371/38; 371/40; 371/51
[58] Field of Search ..................... 371/38, 40, 49, 50, 371/51

[56] References Cited

U.S. PATENT DOCUMENTS

| | | | |
|---|---|---|---|
| 3,159,810 | 12/1964 | Fire | 371/40 |
| 3,221,310 | 11/1965 | Reach, Jr. | 371/51 |
| 3,439,331 | 4/1969 | Brown et al. | 371/38 |
| 3,582,881 | 6/1971 | Burton | 371/40 |
| 3,781,793 | 12/1973 | Henle et al. | 371/49 |
| 4,052,698 | 10/1977 | Ragle | 371/38 |
| 4,059,825 | 11/1977 | Greene | 371/40 |
| 4,107,650 | 8/1978 | Luke et al. | 371/40 |
| 4,156,867 | 5/1979 | Bench et al. | 371/50 |
| 4,168,486 | 9/1979 | Legory | 371/50 |
| 4,276,647 | 6/1981 | Thacker et al. | 371/40 |
| 4,336,612 | 6/1982 | Inoue et al. | 371/38 |

OTHER PUBLICATIONS

G. H. Schulze, How Accurate is Hi-Density Recording?, Control Engineering, Nov. 1978, pp. 52, 53, 55.
B. Arazi, The Optimal Burst-Error Correcting Capability, Information and Control 39, 1978, pp. 303–313.
Hsiao, Single Channel Error Correction in an F-Channel System, IEEE Trans. on Computers, vol. C-17, No. 10, Oct. 1968, pp. 935–943.
Sloane, A Simple Description of an Error Correcting Code for High-Density Magnetic Tape, The Bell System Tech. J., vol. 55, No. 2, 1976, pp. 157–165.
Chen, Double Track Error Correction, etc., IBM Tech. Discl. Bulletin, vol. 20, No. 5, Oct. 1977, pp. 1847–1852.
Chien, Burst-Correcting Codes with High-Speed Decoding, IEEE Trans. on Info. Theory, vol. IT-15, No. 1, 1969, pp. 109–113.
Inoue et al., A New Class of Burst-Error-Correcting Codes, etc., Conf. Record, 1978, National Telecomm. Conf., Birmingham, vol. 2, Dec. 1978, pp. 20.6.1–20.6.5.
Patel, Coding Scheme for Multiple Sections Error Correction, IBM Tech. Discl. Bulletin, vol. 17, No. 2, Jul. 1974, pp. 473–475.
Patel & Hong, Optimal Rectangular Code for High Density Magnetic Tapes, IBM J. of Res. and Dev., vol. 18, No. 26, Nov. 1974, pp. 579–588.
Peterson and Weldon, Error Correcting Codes, 2nd Edition, The MIT Press, 1972, pp. 357–363.

Primary Examiner—Charles E. Atkinson
Attorney, Agent, or Firm—Cushman, Darby & Cushman

[57] ABSTRACT

The error-correcting device for processing data in parallel on a plurality of tracks provides two levels of correction on the basis of redundancy bits added to the transmitted data, namely bits resulting from coding in blocks of serial data on each channel by means of a shortened Fire code (200, 180), and parity bits each relating to one-half of the parallel tracks. An array of decoders delivers the data corrected on the basis of the bits resulting from the Fire code which are substituted when necessary for the data stored in a memory. When the errors in a block of one of the tracks are too long to be corrected in this manner, two parity computers associated with multiplexers permit determination of the erroneous bits.

7 Claims, 4 Drawing Figures

FIG_1
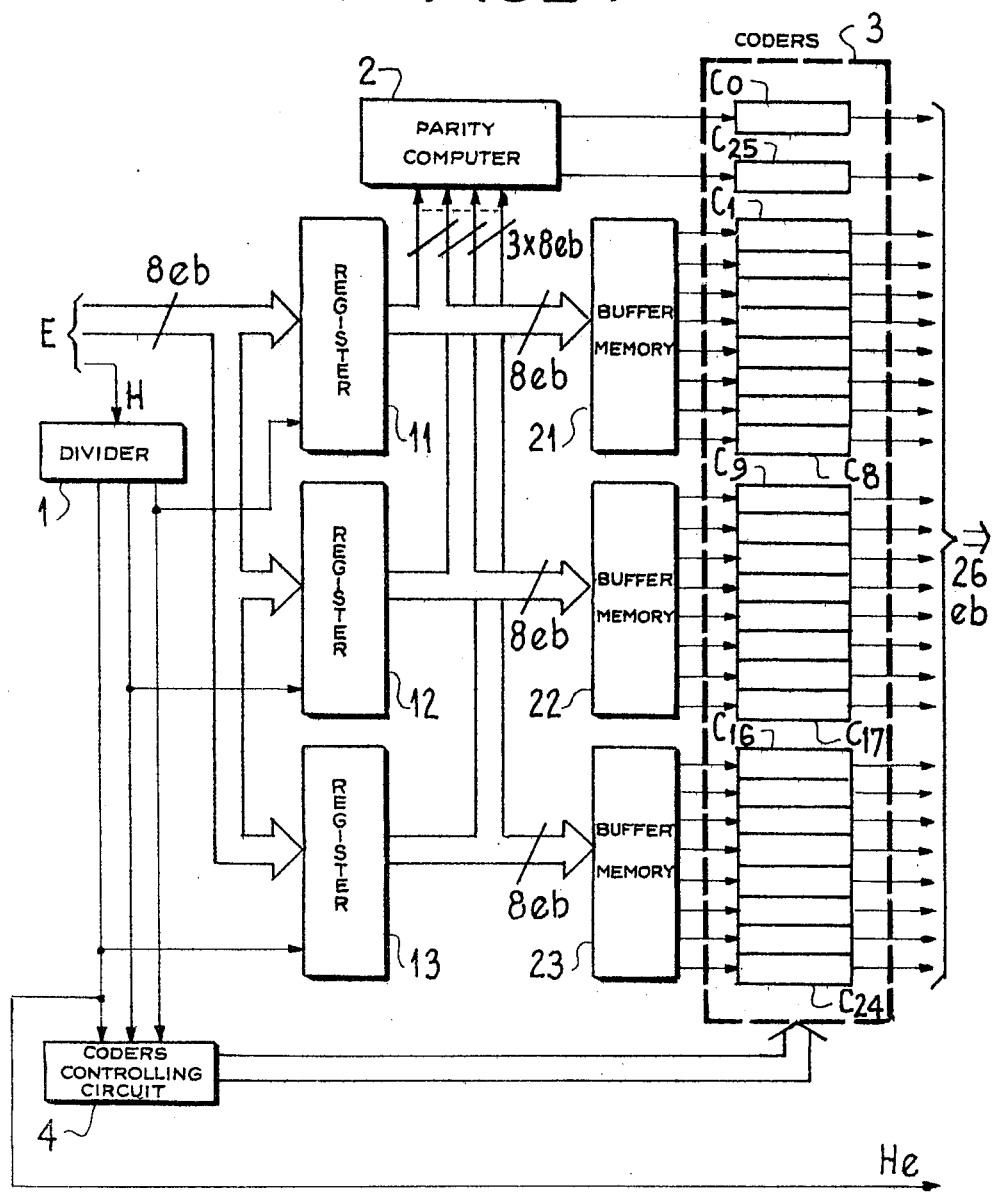

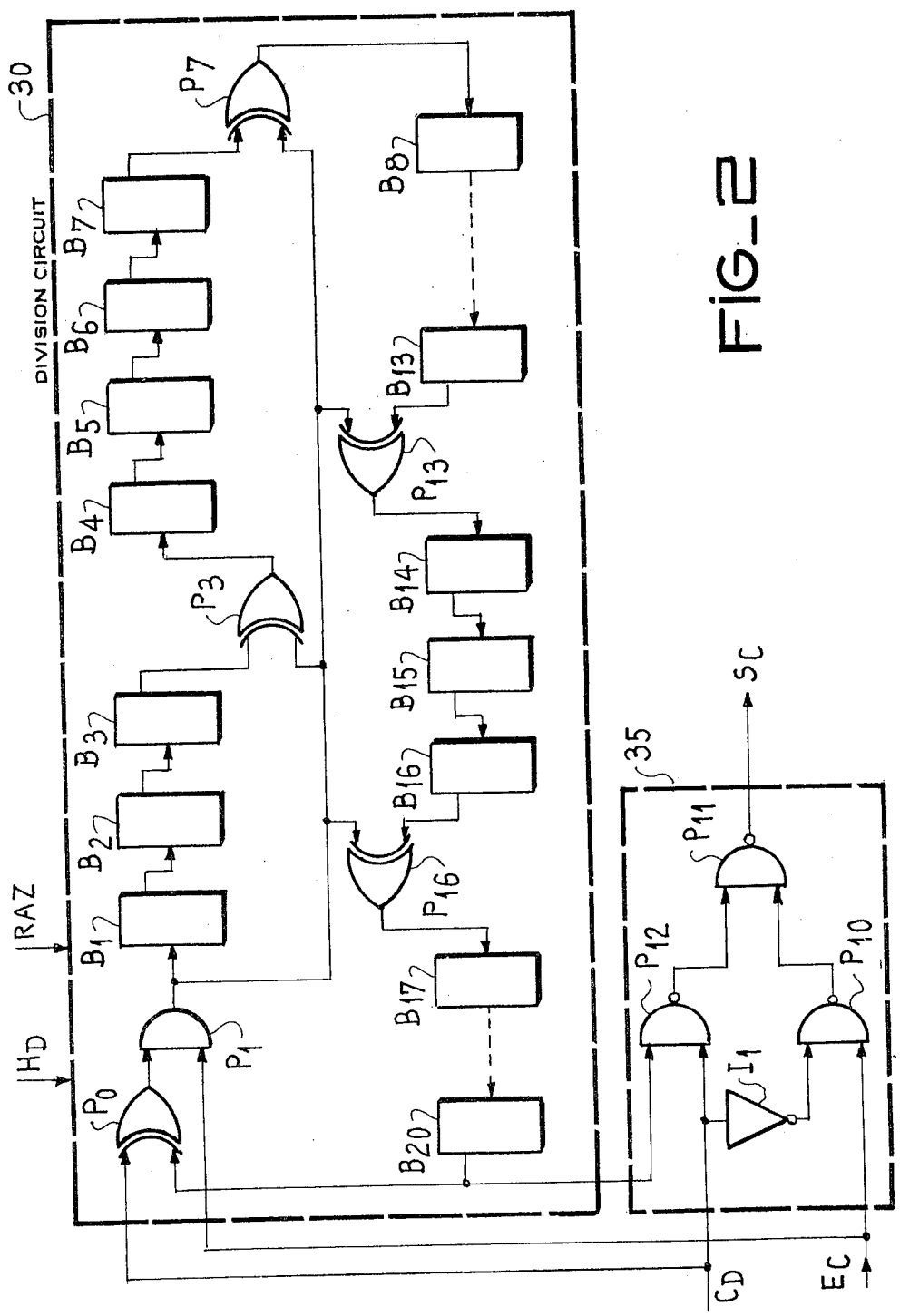
FIG_2

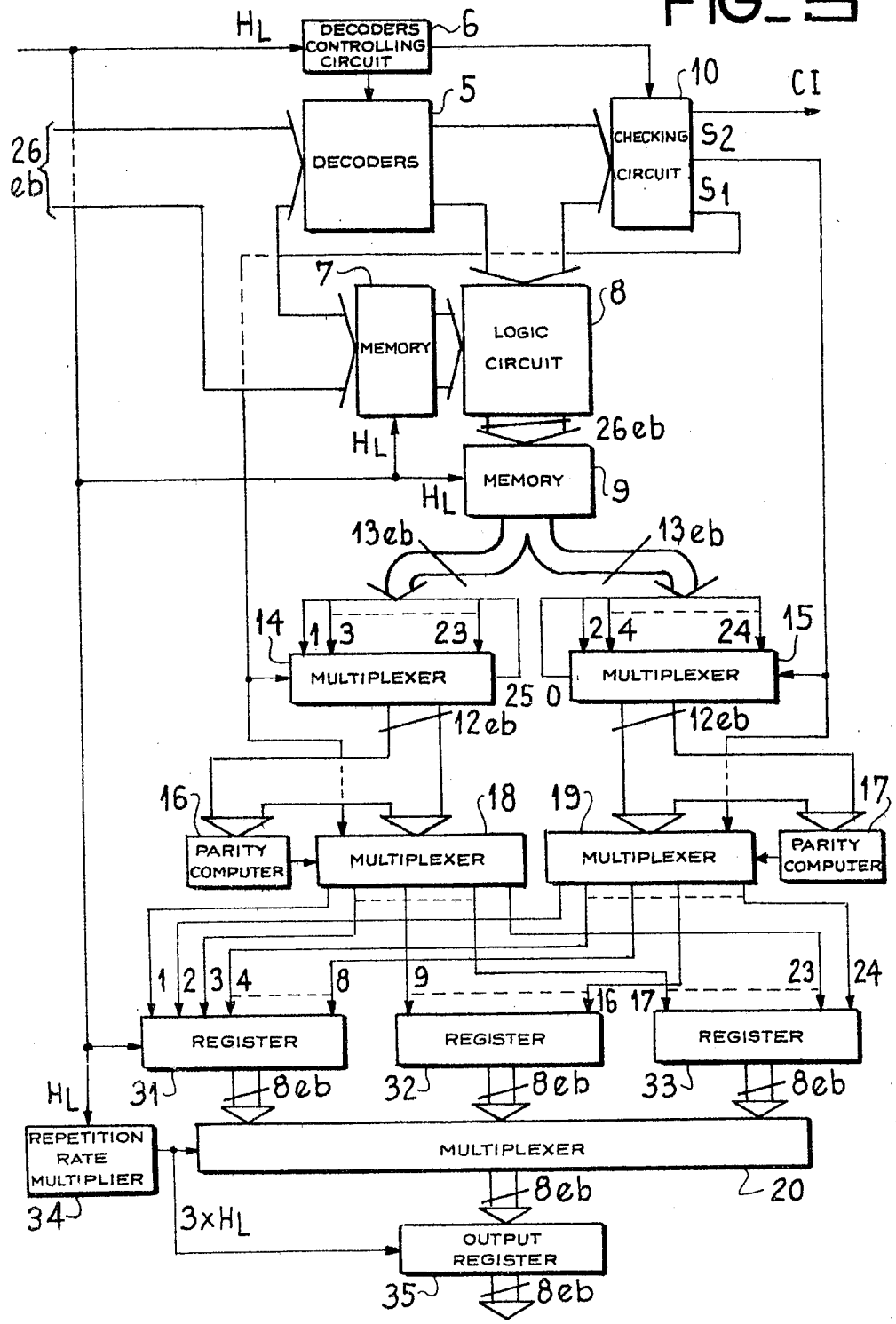

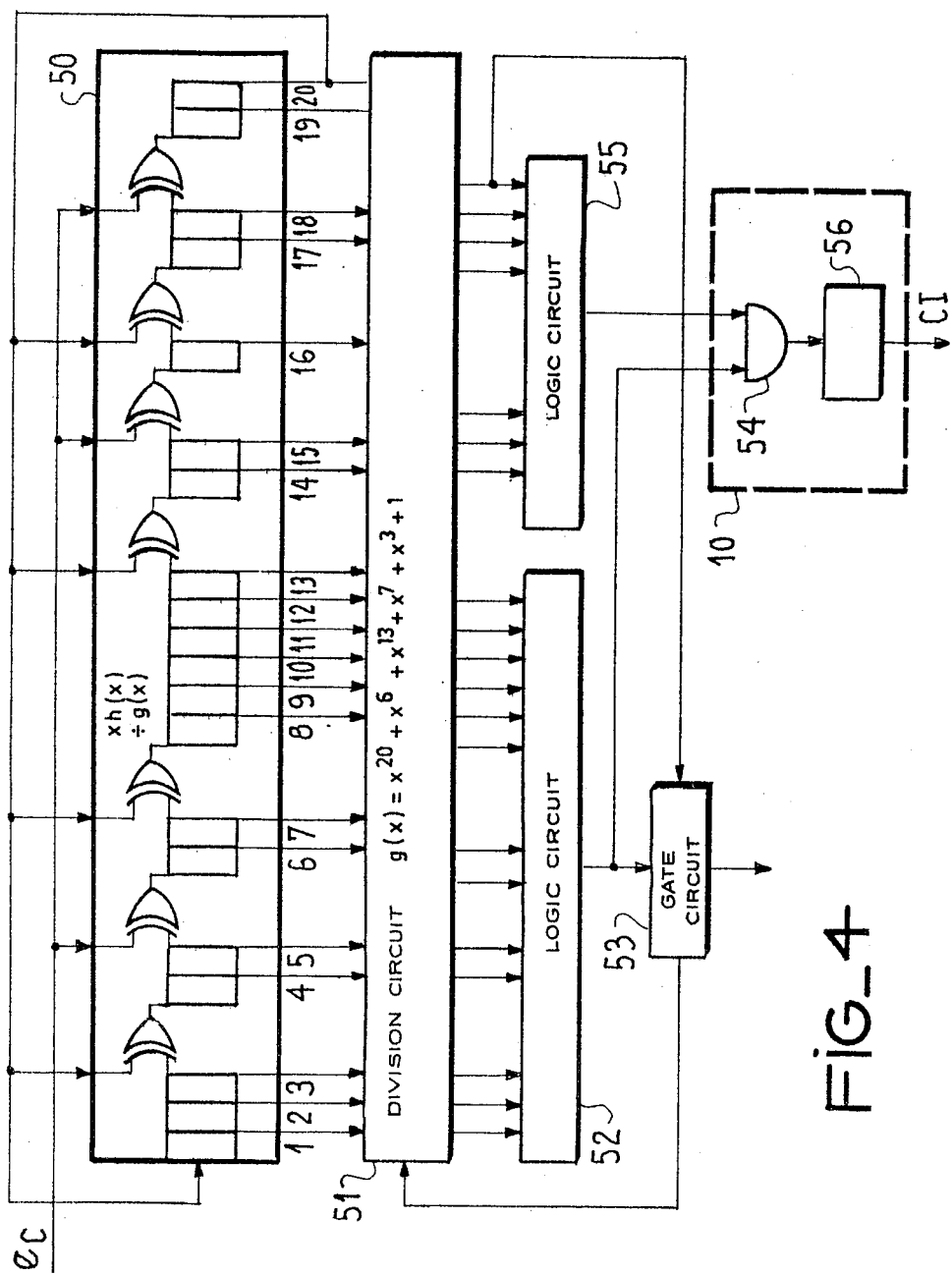
FIG._4

DEVICE FOR REAL-TIME CORRECTION OF ERRORS IN DATA RECORDED ON A MAGNETIC MEDIUM

This invention relates to a device for real-time correction of errors in data recorded on a magnetic recording medium.

High-speed digital data recorder-readers can be employed in particular for magnetic media on which images transmitted in the digital code can be recorded and subsequently restituted for image processing by computer. For processing operations of this type, it is absolutely necessary to ensure that the image restituted by the recorder-reader is totally error-free. To this end, recourse is had to the so-called "dissimulation" techniques which consist, in a first step, in detecting errors and in a second step in masking them by recopying adjacent elements in place of the erroneous elements. These techniques are suitable for the visual display of images since the human eye is tolerant but are ill-suited to restitution for data-processing.

Error-correcting devices are known for correcting errors detected in series of data restituted by low-speed multitrack magnetic recorders. These correcting devices operate on the principle of double parity check, namely a transverse check for which a longitudinal parity track is provided, and a longitudinal parity check for which a transverse parity track is provided. A double crosscheck permits correction of single errors since they are isolated.

Devices also exits in which, at the time of recording, binary elements coded in accordance with the data content in an error-correcting code are written in addition to the data, track by track. Devices of this type permit the correction of isolated errors or small error bursts. The number of errors which can be corrected is clearly a function of the redundancy introduced by the additional bits. The majority of applications make use of shortened block codes which are capable of correcting from 4 to 10 errors with a redundancy ranging from 9.5 to 15%. On this basis, in order to obtain a sufficient correction capacity, it is necessary to adopt interlacing techniques which call for the use of format-changing memories.

In the case of a high-speed magnetic recorder employed in a real-time data-processing system, these different correcting techniques are inadequate.

The invention is directed to a device for real-time correction of errors in data recorded by a high-speed recorder on a multitrack magnetic medium in parallel, in which there is fairly low redundancy of recorded data but in which the device has a high correction capacity. In the field of data-processing applications, when the correction capacity is exceeded, the system indicates that the magnetic medium is faulty and is accordingly rejected.

In accordance with the invention, a device for real-time correction of errors in data recorded on a multitrack magnetic medium comprises a device for processing digital data prior to recording of said data in parallel on a multitrack recorder-reader and a device for processing digital data which are restituted after reading in parallel in the recorder-reader. The main distinctive feature of the device lies in the use of two associated correction modes involving only low total redundancy, a mode of correction of short burst errors starting from redundancy bits introduced by the data-processing device prior to recording by means of error detection and correction coding of the shortened Fire code type which introduces twenty redundancy bits in the case of one block of N serial bits, to be recorded on one track of the recorder, and a long burst error correction mode involving the use of parity bits to be recorded on at least one track to be reserved for this purpose and resulting from the coding of the parallel bits to be recorded simultaneously.

Other features of the invention will be more apparent to those skilled in the art upon consideration of the following description and accompanying drawings, wherein:

FIG. 1 is a diagram of a circuit which serves to process the data received prior to recording on the magnetic medium and forms one section of the correcting device according to the invention;

FIG. 2 is a detailed diagram of a coder circuit employed in the circuit for processing data prior to recording;

FIG. 3 is a general diagram of the circuit which serves to detect and correct errors in the data restituted by the recorder and forms the other section of the correcting device according to the invention;

FIG. 4 is a detailed diagram of a decoder circuit employed in the circuit for detecting errors in the restituted data.

The invention is particularly applicable to digital data processing systems which make use of multitrack magnetic recorders, the data being recorded in parallel on a number of tracks. On these tracks, two types of errors are liable to arise:

short burst errors consisting of 1 to 7 grouped errors;
long errors consisting of 8 to 512 grouped errors.

The correcting device makes it possible to correct these two types of errors in real time.

To this end, two correction levels are employed. At the time of recording, these two levels are each represented by the recording of additional binary elements or bits.

In the case of a first correction level, a particular error detection and correction code is employed: the input data fed to each track are split-up into blocks of 180 bits. There are associated with each block additional bits or so-called redundancy bits resulting from coding of said blocks in an error detection and correction code of the shortened Fire code type. This code permits the correction of a maximum of seven consecutive errors at the time of restitution of the corresponding block of 180 bits starting from twenty redundancy bits and the detection of uncorrected errors with an error rate in this detection which is equal at a maximum to $10^{-7}$.

For a second correction level, two tracks are reserved for recording of parity bits calculated from bits of the same rank recorded in parallel on the other available tracks, for recording of the data; the parity computation is performed by associating the tracks in two groups such as the even tracks and the odd tracks, for example, which will thus provide a parity track corresponding to the even tracks and a parity track corresponding to the odd tracks.

This correcting device and the operation of the device will hereinafter be described with reference to the accompanying drawings.

FIG. 1 shows the "recording section" of the correcting device in accordance with the invention or in other words the device for processing digital data received prior to recording of said data on the multitrack magnetic medium. For high-speed recording of data, the data are recorded in parallel on all the tracks of a multitrack recorder. As a general rule, the digital data arrive in octets at a frequency F.

The input E of the device comprises an input line for transmitting the eight bits in parallel and a clock input H. In the case of a multitrack recorder which makes use of 26-track magnetic tapes, it is possible to record bits in parallel on the 26 tracks. These tracks can be employed as follows:

(a) simultaneous recording of three octets which arrive successively at the input E;
(b) the two additional tracks can then be employed for correction of errors detected at the time of restitution.

In one embodiment of the invention, the two tracks just mentioned are employed for recording parity check bits; one track corresponds to the group of even tracks and the other track corresponds to the group of odd tracks. The corresponding section of the device comprises the following elements: a divider 1 connected to the clock input H for dividing by 3 the frequency F of the clock H and delivering at its three outputs signals having a frequency $f=F/3$, each signal being displaced with respect to the following signal by one period of the signal having a frequency F. The input line is connected to three 8-bit registers 11, 12 and 13, loading of said registers being controlled respectively by the three output signals of the divider applied to their clock inputs. The parallel outputs of said three registers 11, 12 and 13 are connected on the one hand to the multiple inputs of three corresponding buffer memories 21, 22 and 23 and on the other hand to a double parity computer 2.

Since the inputs of said circuit 2 are numbered from 1 to 24, the corresponding data are intended to be written in parallel on the corresponding tracks 1 to 24 of the recorder. The double checking circuit computes two parity bits at intervals of three periods of the input clock or in other words at the frequency f. One parity bit corresponds to the bits which are present on the odd inputs 1, 3, 5 . . . 23 and the other parity bit corresponds to the bits which are present on the even inputs 2, 4 . . . 24.

The first parity bit is intended to be recorded at the same time as the data on one of the two remaining tracks such as track No 25, for example (located at the edge of the tape, for example). The other parity bit is intended to be recorded on the track located on the opposite edge such as track No 0, for example. The buffer memories 21, 22, 23 are such that, when the parity check bits are available on the outputs of the double computation circuit 2, the data which are present on the outputs of said registers are those which have served for computation. The output frequency of the bits of the parity computation circuit and of the buffer memories 21, 22 and 23 is f'.

An array 3 of twenty-six coders $C_0$ . . . $C_{25}$ serves to code the data delivered in series at each output of the circuit 2 and of the registers 21, 22, 23. This coding operation is intended to determine the redundancy bits to be added to a serial bit block and is carried out as follows: the selected code is derived from the Fire code shortened to (200, 180). This write operation means that the serial bits are grouped into blocks of 180 bits from which are determined twenty redundancy bits written next in succession to the 180-bit block, thus resulting in the writing of 200 bits in respect of 180 data bits.

In fact, in order to construct a device which provides maximum ease of material organization, especially for the purpose of decoding and restitution, it is desirable to ensure that the number of bits in the blocks is a "simple" number as in the case of the redundancy bit number. It is also desirable to ensure that the correction capacity is as large as possible with a redundancy which is as low as possible in respect of blocks having a given length.

In point of fact, a code derived from the Fire code (1662, 1643) shortened to (200, 180) makes it possible to correct short errors (1 to 7 errors in a burst) the redundancy introduced is small and equal to 10%. The total redundancy, taking into account the periodicity of the blocks and the parity bits is accordingly as follows:

$$\frac{\text{given bits}}{\text{recorded bits}} = \frac{180 \times 24}{200 \times 26} = 0.83,$$

namely a redundancy of 17%.

The error rate which is undetectable by the shortened Fire code (200, 180) is $9 \times 10^{-7}$.

The coders $C_0$ to $C_{25}$ therefore split-up the data transmitted to their inputs into 180-bit blocks and add the corresponding 20 bits to each block. To this end, a coder controlling circuit 4 receives the clock signals derived from the divider 1 and generates the control signals which are intended to be delivered to the coders. The structure and operation of the coders will hereinafter be described in detail with reference to FIG. 2.

The outputs of the twenty-six coders and the writing clock output $H_c$ which transmits a clock signal corresponding to the frequency of binary data delivered by the coders are to be connected to the corresponding inputs of the multitrack magnetic recorder which is employed for the recording operation followed by reading of the data.

In FIG. 2, which is a more specific diagram of one of the coders, the data to be coded appear in series on the input $E_C$ of the coder. Said data are transmitted on the one hand to the data output $S_C$ of said coder via a circuit 35 and on the other hand to a circuit 30 for division by the Fire code generator polynomial. This polynomial is:

$$\text{polynomial is: } g(x) = (x^{13} + 1)(x^7 + x^3 + 1)$$
$$x^{20} + x^{16} + x^{13} + x^7 + x^3 + 1.$$

This code is normally used for coding long data blocks with 1643 serial bits providing twenty redundancy bits. In the device according to the invention, coding is performed as indicated in the foregoing on short blocks of 180 bits. The division circuit 30 in each coder $C_i$ performs the division of the polynomial formed by the sequence of the input bits by the polynomial g(x) and therefore produces the twenty redundancy bits which are transmitted to the sequence of 180 information bits. To this end, the clock for calling data in the buffer registers is a clock having a period T' which is shorter than the period T of the input clock and such that $180T = 200T'$; 180 clock pulses having a period T' serve to withdraw the bits from a block; then during twenty periods of the signal having a period T', there is no information output from the image memory formed by the buffer memories (21, 22, 23). A control signal consisting of twenty clock pulses then permits transmission, in succession to said 180 bits, of the twenty bits which form the result of the division. The division circuit comprises twenty cascade-connected flip-flops $B_1$ to $B_{20}$ (the flip-flops $B_9$ to $B_{12}$ and $B_{18}$ and $B_{19}$ have not been illustrated for the sake of enhanced clarity of the drawing), the output of one flip-flop being connected to the input of the following flip-flop either directly or via an exclusive-OR gate respectively designated as $P_3$, $P_7$, $P_{13}$, $P_{16}$ in the case of the flip-flops of ranks 3, 7, 13, 16. The output of the last flip-flop of rank 20 is connected to the input of the circuit through an exclusive-OR input gate $P_o$. The second inputs of the gates $P_3$, $P_7$, $P_{13}$, $P_{16}$ are connected to the input of the flip-flop $B_1$. An AND-gate $P_1$ inserted between the output of the gate $P_o$ and the input of the flip-flop $B_1$ receives on its second input a division control signal $C_D$ delivered by the coder management circuit (designated by the reference numeral 4 in FIG. 1).

The coding circuit $C_i$ further comprises a shifting clock input $H_D$ connected to the shifting inputs of the 20 flip-flops and a zero-reset input RAZ connected to the zero-reset inputs of said flip-flops. The input of the division circuit receives the sequence of 180 bits from the image memory. As mentioned in the foregoing, this sequence is also applied to a first input of a circuit 35 and transmitted by this latter directly to the output of the coder $C_i$ via two NAND-gates $P_{10}$ and $P_{11}$. The gate $P_{10}$ receives on its second input the division control signal which is reversed by an inverter $I_1$. The 20-bit sequence forming the result of the division and delivered by the circuit 30 is applied to the input of a third NAND-gate $P_{12}$ of the circuit 35, the second input of which receives the division control signal directly. The output of said gate $P_{12}$ is connected to the second input of the gate $P_{11}$, the output of which is the output of the coder circuit $C_i$, $S_C$.

The associated circuit for detecting and correcting errors in the data restituted by the recorder is illustrated in FIG. 3. Both reading and recording of data can be performed in parallel on all the tracks of the recorder. In the case of a recorder of the type described in the foregoing and comprising twenty-six tracks, provision is made for twenty-six data-reading outputs corresponding to said twenty-six tracks. A reading clock output is also provided in the recorder. This clock output delivers a clock signal $H_L$ which is synchronous with the binary data delivered in parallel on the twenty-six tracks. The twenty-six outputs of the recorder are to be connected to the inputs of twenty-six decoders $D_o$ to $D_{25}$ forming an assembly 5 for detecting the errors from the error detection and correction code which has produced the twenty redundancy bits added to each of the blocks of 180 data bits.

The operation of said decoders $D_o$ to $D_{25}$ is controlled by a decoder controlling circuit 6, the input of which is to be connected to the reading clock output of the recorder.

The structure and operation of the error-correcting decoders are explained hereinafter with reference to FIG. 4.

The decoders deliver the sequence of correction bits at the same rate as the read data. While the read data are processed by the error-correcting decoders, said data are also transmitted at the same time to a memory 7 having a capacity of 192×26 arranged in twenty-six lines of 192 bits. Only the 180 useful data bits forming the blocks are stored in said memory. Detection and correction of errors is such that, at the end of reading of one block and of the corresponding redundancy bits, the error detecting and correcting decoders $D_o$ to $D_{25}$ deliver a sequence of 180 bits in which the 1's indicate the presence of an error.

A logic circuit 8 formed by exclusive-OR gates receives simultaneously the data read on the twenty-six lines of the memory 7 and the twenty-six output bits of the assembly 5 of error-detecting decoders $D_o$ to $D_{25}$. Thus, when a 1 indicates the presence of an error, the 0 or 1 bit which is present in the memory is corrected, the output of the OR-gate being then either 1 or 0 respectively. When a 0 indicates that there are no errors, the output of the OR-gate reproduces the bit which is present on its second input, namely 0 or 1.

The outputs of the twenty-six OR-gates which form said logic circuit 8 are connected to twenty-six inputs of a second memory 9 formed of twenty-six lines in which are recorded the 180-bit blocks thus processed. In fact, it is only at the end of correction of a data block that it is possible to know whether the block is really corrected or whether the configuration of errors in said block was such that the correction capacity of the error-correction code was not sufficient to permit correction of these errors.

A checking logic circuit 10 receives the sequences of bits delivered by the assembly 5 of error detecting and correcting decoders $D_o$ to $D_{25}$. This logic circuit is controlled by a control signal delivered by the decoder management circuit 6. When the number of errors detected is greater than the correction capacity of the device, the logic circuit 10 delivers a signal CI which indicates that the configuration of the detected errors is such that it exceeds the correction capacity of the device.

When the configuration of detected errors can be corrected or in other words when a long error is detected on only one of the even or odd tracks (or possibly one long error on only one even track and also one long error on only one odd track, these two tracks being adjacent if so required), the correction consists in a first step in replacing the track which presents errors by the associated parity track $P_o$ or $P_{25}$ according as the track to be replaced is either an even or odd track, and then in calculating the initial data by performing a parity computation of the group of tracks concerned (even or odd tracks). A final step of the correction then consists in replacing the erroneous data of the track to be corrected by the bits obtained as a result of the parity computation. The portion of the detection and correction circuit corresponding to this correction is provided for this purpose with two multiplexers 14 and 15 connected to the outputs of the memory 9. This memory 9 has twenty-six outputs corresponding to its twenty-six lines which in turn correspond to the twenty-six read tracks of the recorder. The multiplexer 14 has thirteen signal inputs connected to the outputs of the memory 9 corresponding to the odd lines and one control input connected to the output $S_1$ of the checking logic circuit 10 which indicates the number of the odd track to be corrected.

Similarly, the multiplexer 15 has thirteen signal inputs connected to the outputs of the memory 9 corresponding to the even lines and one control input connected to the output $S_2$ of the checking logic circuit 10 which indicates the number of the even track to be corrected. The multiplexers 14 and 15 are such that the data which are present on their inputs and respectively of rank 25 and of rank 0 replace the data on the input of rank $2n+1$ or of rank 2n, where 2n+1 and 2n are the numbers of tracks to be corrected as given by the control inputs. The multiplexers 14 and 15 have twelve outputs connected respectively to the twelve inputs of two parity computers 16 and 17 and also to the twelve first inputs of two other multiplexers 18 and 19 respectively. The outputs of the parity computers 16 and 17 are connected to a thirteenth input of the multiplexers 18 and 19 respectively.

These multiplexers operate in the same manner as the previous multiplexers. Their control inputs are also connected to the outputs $S_1$ and $S_2$ of the checking logic circuit in order to select from the twelve first inputs of the multiplexer the particular input which has to be replaced by the thirteenth input.

The outputs of said multiplexers 18 and 19 then deliver the corrected bit sequences.

The last step in order to achieve reconstruction of the sequence of eight-bit bytes which has given rise to the recording then consists in suitably regrouping the outputs of said multiplexers in order to reconstitute the three eight-bit bytes which have been recorded simultaneously and to restitute them sequentially in their order of arrival.

To this end three eight-input registers 31, 32 and 33 respectively are connected to the outputs of the multiplexers and regroup the bits in order to reconstitute the input eight-bit bytes. A multiplexer having 20 to 24 inputs successively transmits the eight bits which are present on the outputs of the registers 31, 32 and 33 to its eight outputs.

With this objective, the reading clock signal $H_L$ received from the recorder is applied to a repetition-rate multiplier circuit 34 which multiplies by three the repetition rate of the clock signal which is received by said circuit. The eight outputs of the multiplexer 20 are connected to the eight inputs of an output register 35 which delivers the sequence of eight-bit bytes at a repetition rate which is equal to three times the repetition rate of the reading clock of the recorder.

As will readily be understood, the reading clock $H_L$ controls the checking circuit 10 but also the storage in the memories 7 and 9 as well as the exit of information from the memories (these memories are in fact constituted by twenty-six shift registers); the clock $H_L$ also controls the transfer of data from the registers 31, 32 and 33 to the multiplexer 20.

FIG. 4 is a schematic diagram of a decoding circuit $D_i$ and serves to provide a more precise explanatory illustration of the operation of the error-correcting decoder in accordance with the invention.

As has been mentioned earlier, the coding circuits $C_i$ utilize a shortened Fire code; in other words, instead of coding blocks of 1643 bits, they code short blocks of 180 bits. In order to achieve correct decoding on reception, this shortening of blocks must be taken into account. Accordingly, before carrying out the division of restituted blocks of binary data by the generating polynomial $g(x)$, these data are multiplied by the remainder of the base-2 division of $x^{1471}$ by the generating polynomial $g(x)$, this remainder being the polynomial $$h(x) = x^{18} + x^{15} + x^5[x^{1471} = x^{(1643-192)+20}],$$

where the value 1643 represents the length of the blocks in the unshortened Fire code, the value 192 represents the length increased to the higher eight-bit byte of the blocks in the code chosen and the value 20 represents the number of redundancy bits. In practice, multiplication by h(x) and division by g(x) can be simultaneous.

The decoder $D_i$ therefore comprises a circuit 50 for multiplication by h(x) and for division by g(x). One example of construction of this circuit is shown in FIG. 4. In the same manner as the corresponding coder, this decoder comprises twenty flip-flops in series, the output of one flip-flop being connected to the input of the following flip-flop or directly via an exclusive-OR gate in the case of a first series of flip-flops of ranks 3, 7, 13, 16 and in the case of a second series of flip-flops of ranks 5, 15 and 18.

The second inputs of the gates corresponding to the first series (polynomial g(x)) are connected to the output of the flip-flop of rank 20. The second inputs of the gates corresponding to the second series (polynomial h(x)) are connected to the coded-signal input $e_c$. This circuit therefore makes it possible to multiply the polynomial formed by the sequence of data restituted by the recorder by $h(x) = x^5 + x^{15} + x^{18}$ and to divide simultaneously by $g(x) = x^{20} + x^{16} + x^{13} + x^7 + x^3 + 1$. This process is carried out on each block of two hundred restituted bits; the result consisting of twenty bits is obtained on the outputs of the twenty flip-flops at the end of each block.

When the data bits have not been affected by the errors, this result is zero. In other words, twenty 0's are present on the outputs of the flip-flops. In this case, the 180 bits of the block which are recopied in the memory 7 (FIG. 3) pass out of said memory one by one and are recopied in the memory 9 (as shown in FIG. 3) without being corrected.

On the other hand, if the result is different from 0, one or a number of errors have been introduced.

It is necessary in such a case to detect the location of the errors in the sequence of data in order to correct them while at the same time beginning to process the following block. To this end, the twenty bits forming the result of the process are transferred to a second circuit 51 for division by the polynomial g(x). This second division circuit receives bits in parallel and not bits in series. As in the case of the first circuit, however, this division circuit comprises a loop providing feedback from the twentieth output to the input shown in the figure externally of the divider since a switching circuit 53 is provided in said loop. During the division, when the first thirteen bits of the result are 0's, the seven following bits accordingly indicate the location of the error in the sequence of data. This combination is detected by an AND-gate circuit 52; when it has been detected, an opening control signal is delivered to the gate circuit 53 which opens the loop of the division chain of the circuit 51.

When this proves necessary, said gate circuit 53 also controls the correction, in which case the corresponding "1" signal (which indicates the presence of an error) is delivered to the OR-gate circuit 8 of FIG. 3 in order to reverse the erroneous bit delivered at the same time by the memory 7 (as shown in FIG. 3).

If the aforementioned first thirteen outputs of the circuit 51 are never simultaneously at 0 during the division operation (and if the result of the first processing operation of the circuit is different from 0), the detected errors exceed the correction capacity of the code. This configuration is detected by means of an AND-gate 54, the two inputs of which are connected respectively to the output of the OR-gate logic circuit 52 and to the output of a second OR-gate logic circuit 55, the inputs of which are connected to the outputs 14 to 20 of the division circuit 51. The output of said gate is connected to the input of a detection circuit 56. The output of said detection circuit delivers a signal $C_f$ which is matched with the management computer of the system for indicating that the configuration of detected errors cannot be corrected by the correction code employed. The gate 54 and said detection circuit 56 are included in the diagram of FIG. 2 in the checking logic circuit 10.

Thus, as indicated in the foregoing, when a single track (or two tracks having different parities) cannot be corrected, a signal $S_1$ or $S_2$ indicates the parity of said track (or of both tracks) and the correction is then carried out from the track (or tracks) of corresponding parity.

It should be pointed out that, in practice, since the detection code makes it possible to correct short bursts of seven errors on each track, there are seldom observed more than two error configurations which cannot be corrected by means of this code and make it necessary to have recourse to the parity tracks. Insufficiency of the system is consequently a rare occurrence.

The invention is clearly not limited to the embodiment which has been specifically described with reference to the accompanying drawings but has been given solely by way of example.

In particular, in order to help fix ideas, a certain number of numerals have been indicated in regard to the number of tracks recorded and read simultaneously as well as in regard to the number of serial bits in the data blocks. In practice, these indications may be modified in order to take account of the recorder which is employed.

Nevertheless, as far as concerns the correction code proper, the Fire code shortened to (200, 180) is convenient by reason of the simplicity of the numbers of elements employed.

What is claimed is:

1. A device for encoding data to provide redundancy bits and parity bits on data recorded on a multitrack medium comprising:
    means for processing data in the form of a sequence of data by dividing said sequence into a plurality of parallel data blocks each to be recorded on a track of said medium and each bit of said blocks having a corresponding parallel bit on the other tracks;
    first means for coding on at least one of said tracks a sequence of parity bits in sequential blocks produced by operation on the corresponding parallel bits to be recorded on tracks as blocks; and
    second means for coding each of data blocks and said blocks of parity bits with a plurality of n serial redundancy bits in the form of the shortened Fire code type in each block of N serial bits.

2. A device as in claim 1 wherein said first coding means includes means for coding sequences of parity bits on each of first and second tracks, each corresponding to one group of data block sequences.

3. A device as in claim 1 wherein said Fire code is shortened to (200, 180) N being equal to 180 and n being equal to 20.

4. A device as in claim 1 wherein said processing means includes means for multiplexing the data to be recorded in order to a number of said sequences of parallel data blocks on k tracks and wherein said first coding means includes k elementary coders for each computing the redundancy bits for each data block.

5. A device as in claim 4 including means for reading said data blocks on said tracks and restituting said data.

6. A device according to claim 5 wherein, for coding in accordance with a Fire code, each elementary coder comprises a circuit for dividing by the generating polynomial of the Fire code $g(x) = x^{20} + x^{16} + x^{13} + x^7 + x^3 + 1$ for receiving a sequence of bits on its input and delivering on its output the twenty redundancy bits transmitted in succession to each serial data block.

7. A device according to claim 4 or claim 6, wherein said processing means comprises two circuits for receiving the restituted data, said two circuits being constituted by a decoding circuit composed of k elementary decoders and by a memory circuit, a correction circuit for receiving the data which are present on the outputs of the decoding circuit and the data which are present on the outputs of the memory circuit in order to correct the short burst errors, a logic circuit for detecting long burst errors, a circuit for correcting long burst errors comprising parity computers and multiplexers, the outputs of said correcting circuit being connected to the inputs of a multiplexing circuit comprising registers and a multiplexer for delivering the corrected data to an output register.

* * * * *